(12) United States Patent
Kimura et al.

(10) Patent No.: US 8,194,432 B2
(45) Date of Patent: Jun. 5, 2012

(54) FERROELECTRIC MEMORY DEVICE FOR ADJUSTING THE CAPACITOR OF A BIT LINE

(75) Inventors: Hiromitsu Kimura, Kyoto (JP); Takaaki Fuchikami, Kyoto (JP); Yoshikazu Fujimori, Kyoto (JP)

(73) Assignee: Rohm Co., Ltd., Kyoto-Fu (JP)

( * ) Notice: Subject to any disclaimer, the term of this patent is extended or adjusted under 35 U.S.C. 154(b) by 0 days.

(21) Appl. No.: 12/918,396

(22) PCT Filed: Jan. 8, 2009

(86) PCT No.: PCT/JP2009/050150
§ 371 (c)(1),
(2), (4) Date: Aug. 19, 2010

(87) PCT Pub. No.: WO2009/107409
PCT Pub. Date: Sep. 3, 2009

(65) Prior Publication Data
US 2010/0321975 A1    Dec. 23, 2010

(30) Foreign Application Priority Data
Feb. 28, 2008  (JP) ................. 2008-048174

(51) Int. Cl.
*G11C 11/22* (2006.01)
(52) U.S. Cl. .................. 365/145; 365/149; 365/189.09
(58) Field of Classification Search .......... 365/145, 365/149, 189.09
See application file for complete search history.

(56) References Cited

U.S. PATENT DOCUMENTS

| | | | |
|---|---|---|---|
| 5,381,364 A | 1/1995 | Chern et al. | |
| 5,414,654 A | 5/1995 | Kubota et al. | |
| 5,572,459 A * | 11/1996 | Wilson et al. | 365/145 |
| 6,924,997 B2 * | 8/2005 | Chen et al. | 365/145 |
| 7,173,844 B2 * | 2/2007 | Lee et al. | 365/145 |
| 8,014,186 B2 * | 9/2011 | Kimura et al. | 365/145 |

FOREIGN PATENT DOCUMENTS

| | | |
|---|---|---|
| JP | 06-125056 | 5/1994 |
| JP | 07-147094 | 6/1995 |
| JP | 08-203266 | 8/1996 |
| JP | 2005-175311 | 6/2005 |

OTHER PUBLICATIONS

International Search Report from PCT application JP2009/050150 (dated Apr. 28, 2009).

* cited by examiner

*Primary Examiner* — Connie Yoha
(74) *Attorney, Agent, or Firm* — Fish & Richardson P.C.

(57) ABSTRACT

By separately setting a capacitor on BL depending on whether the mode is a DRAM mode or an FRAM mode, it is compatible with improvement in a speed by BL capacitor reduction in the DRAM mode and a sufficient BL capacitance in the FRAM mode.

A ferroelectric memory device includes: a plurality of bit lines BL disposed in a column direction; a plurality of word lines WL disposed in a row direction; a plurality of plate lines PL and a bit line capacitor control signal BLC; a ferroelectric memory cell (32) disposed at an intersection of the plurality of bit lines BL, the plurality of word lines WL, and the plurality of plate lines PL, and composed of a ferroelectric capacitor CF and a memory cell transistor QM; and a load capacitor adjustment cell (34) disposed at an intersection of the plurality of bit lines BL and the bit line capacitor control signal BLC, and composed of a load capacitor CL and a load capacitor adjustment transistor QL.

8 Claims, 12 Drawing Sheets

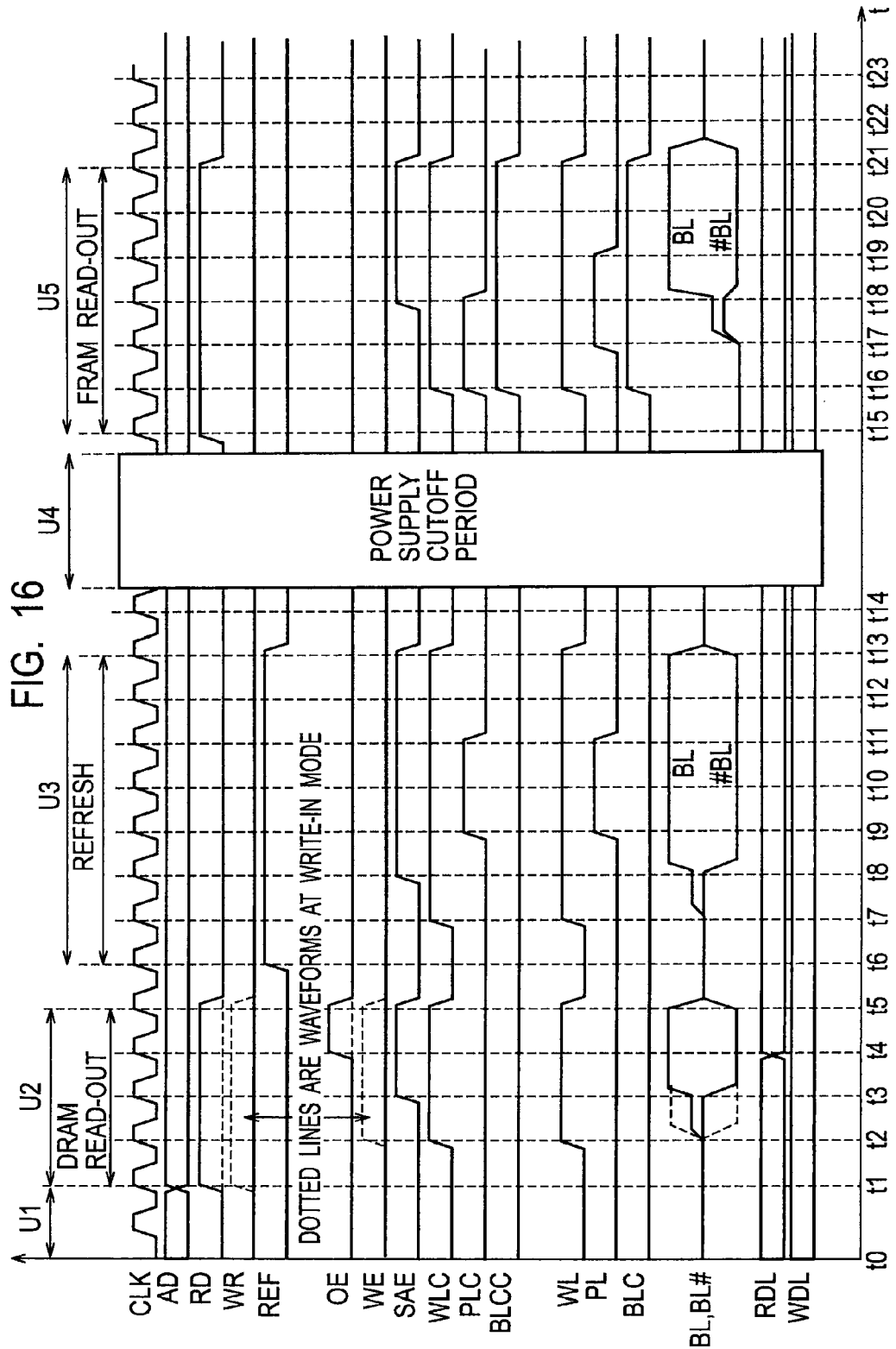

FERROELECTRIC MEMORY DEVICE FOR ADJUSTING THE CAPACITOR OF A BIT LINE

TECHNICAL FIELD

The present invention relates to a ferroelectric memory device, in particular relates to a ferroelectric memory device which adjusts a capacitor of a bit line to which a memory cell is connected.

BACKGROUND ART

A Ferroelectric Random Access Memory (FRAM (registered trademark)) has achieved nonvolatile storage characteristics of stored data (for example, holding performance for about ten years), and excellent characteristics of a high speed data write-in performance for about several 10 ns for example, by using hysteresis characteristic which a ferroelectric capacitor has.

On the other hand, since it is necessary to drive comparatively large capacitor for control of the hysteresis characteristic of the ferroelectric capacitor, it is difficult to achieve a high speed operation of a Static Random Access Memory (SRAM) level having access time for about several ns for example, in the present condition. Moreover, since the characteristics of the ferroelectric capacitor deteriorated gradually whenever it repeated a polarization inversion, there was a problem that the number of times of data rewriting is limited to about $10^{14}$ times per one capacitor.

In order to solve the problem, there is a method of using a ferroelectric capacitor as a mere capacitative element at the time of normal operation mode, performing a Dynamic Random Access Memory (DRAM) mode operation for holding data with quantity of electrically charged up charges, and performing an FRAM mode operation for non-volatilizing data using the hysteresis characteristic only at the time of power supply cutoff (for example, refer to Patent Literature 1 and Patent Literature 2).

In the method, since an improvement in a speed of the operation can be achieved by not using the hysteresis characteristic at the time of normal operation mode, but reducing a capacitor to drive, and polarization inversion is not occurred, it is effective in the ability to suppress a characteristic degradation of a device.

In the DRAM mode, it becomes advantageous to high speed operation so that a Bit Line (BL) capacitor to which a memory cell is connected is small, but on other side, in the FRAM mode, a large Bit Line (BL) capacitor is needed in order to read a residual polarization electric charge. Since the BL capacitor can be applied small by the trade-off only in the range in which the FRAM mode can operate, the improvement in the speed has limitations.

When holding data also in a power OFF period, it is necessary to perform data write-in with the FRAM mode for a memory cell which is operating in the DRAM mode, and to non-volatilize the data, at the time of power supply cutoff. Accordingly, the operating time in the FRAM mode needed at the time of power supply cutoff becomes long as memory space becomes large.

Patent Literature 1: Japanese Patent Application Laying-Open Publication No. H06-125056
Patent Literature 2: Japanese Patent Application Laying-Open Publication No. H08-203266

SUMMARY OF INVENTION

Technical Problem

When a BL capacitor is unchanged, it is necessary to set up a capacitance value in the range of in which both the DRAM mode and the FRAM mode can operate. For this reason, there was a limitation to achieve the improvement in speed by reduction of the BL capacitor. Although the subject of FRAM in a hybrid memory use is in an improvement in an access speed, in the non-volatile (FRAM) operation with large capacitor load, the improvement in the speed is difficult.

The object of the present invention is to provide a ferroelectric memory device compatible in improvement in the speed by the BL capacitor reducible with the DRAM mode, and the BL capacitor securing in the FRAM mode, by providing a load capacitor adjustment cell on the BL and separately setting a capacitor on BL between the DRAM mode and the FRAM mode.

Also, the object of the present invention is to provide a ferroelectric memory device which is operated in the DRAM operational mode with a small capacitor load for a high speed operation at the time of normal operation mode, and is operated in the FRAM operational mode for a data hold of a power OFF period at the time of power ON/OFF.

Solution to Problem

According to one aspect of the present invention for achieving the above-mentioned object, it is provided of a ferroelectric memory device comprising: a plurality of bit lines disposed in a column direction; a plurality of word lines intersecting perpendicularly with the bit lines and disposed in a row direction; a plurality of plate lines intersecting perpendicularly with the bit lines and disposed in a row direction; a bit line control line intersecting perpendicularly with the bit line and disposed in a row direction; a ferroelectric capacitor disposed at an intersection of the plurality of the bit lines, the plurality of the word lines, and the plate line, an electrode of one side of the ferroelectric capacitor being connected to the plate line; a ferroelectric memory cell composed of a memory cell transistor connecting a source to an electrode of another side of the ferroelectric capacitor, connecting a drain to the bit line, and connecting a gate to the word line; a load capacitor disposed at an intersection of the plurality of bit lines and the bit line control line, and an electrode of one side of the load capacitor being connected to ground potential; and a load capacitor adjustment cell composed of a load capacitor adjustment transistor connecting a source to an electrode of another side of the load capacitor, connecting a drain to the bit line, and connecting a gate to the bit line control line.

Advantageous Effects of Invention

According to the present invention, it can be compatible in improvement in a speed by the BL capacitor reducible in the DRAM mode, and BL capacitor securing in the FRAM mode, by providing the load capacitor adjustment cell on the BL, and separately setting the capacitor on the BL between the DRAM mode and the FRAM mode.

According to the ferroelectric memory device of the present invention, it can be made to operate by the DRAM operational mode with small capacitor load for high speed operation at the time of the normal operation, and can be made to operate by the FRAM operational mode for the data hold of the power OFF period at the time of power ON/OFF.

According to the ferroelectric memory device of the present invention, improvement in the speed of operating speed of the same grade as the SRAM can achieve.

Also, according to the ferroelectric memory device of the present invention, improvement in the speed of the data restoring process at the time of the power supply cutoff can be achieved.

Moreover, according to the ferroelectric memory device of the present invention, the characteristic degradation of the ferroelectric device by the number of times reduction of polarization inversion can be suppressed.

BRIEF DESCRIPTION OF THE DRAWINGS

FIG. 16 An operation timing chart diagram of one bank of the ferroelectric memory device according to the first embodiment of the present invention.

REFERENCE SIGNS LIST

Figure 1:
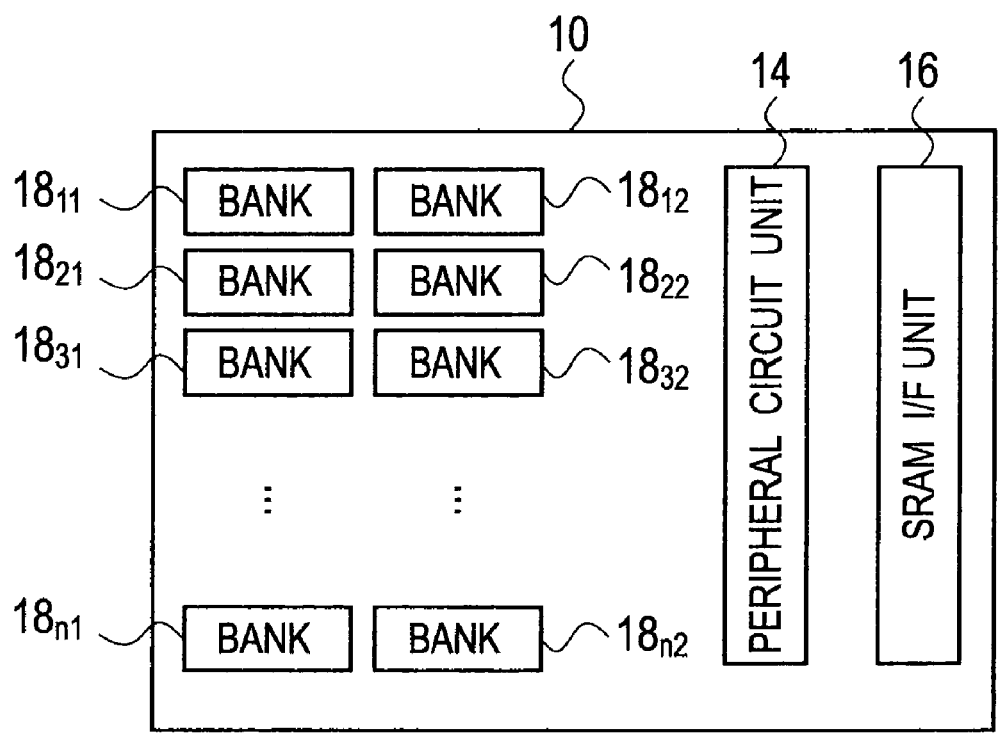
FIG. 1 A schematic block configuration diagram of a ferroelectric memory device according to a first embodiment of the present invention.

10: Ferroelectric memory device;
14: Peripheral circuit unit;
16: SRAM interface (I/F) unit;
18, $18_{11}$, $18_{12}$, ..., $18_{n1}$, $18_{n2}$: Bank;
20a, 20b, 20c, 20d: Row decoder;
22, 22a, 22b, 22c, 22d: WL/PL driver;
24a, 24b, 25a, 25b: FRAM cell array unit;
26: Load capacitor adjustment array unit;
28: Sense amplifier and column decoder;
30: Pre-decoder;
32: Ferroelectric memory cell;
34: Load capacitor adjustment cell;
36: Load capacitor switching unit;
38: Sense amplifier (SA);
40: I/O control unit (IO);
42: Memory control sequencer;
BLC: Bit line capacitor control signal;
$C_F$, $C_{F1}$, $C_{F2}$, $C_{F3}$: Ferroelectric capacitor;
$C_S$: Value of ferroelectric capacitor CF;
$C_B$: Bit line capacitor;
$C_L$: Load capacitor;
$V_S$: Voltage stored in ferroelectric capacitor CF;
$V_B$: Voltage of bit line BL;
BL, #BL, BLT, BLB: Bit line;
WL, WLT, WLB: Word line;
PL, PLT, PLB: Plate line;
AD: Address signal;
DS: Data signal;
AR: Row address signal;
AC: Column address signal;
RDL: Read-out data signal;

WDL: Write-in data signal;
WLC: Word line control signal;
PLC: Plate line control signal;
BLCC: Bit line capacitor control signal;
SAE: Sense amplifier control signal;
OE: Output control signal;
WE: Input control signal;
RD: Read-out request signal;
WR: Write-in request signal;
REF: Refresh request signal; and
CLK: Clock signal.

DESCRIPTION OF EMBODIMENTS

Next, an embodiment of the invention will be described with reference to drawings. It explains simple by attaching the same reference numeral as the same block or element to below, and avoiding duplication of description. The drawing is schematic and it should care about differing from an actual thing. Of course, the part from which the relation and ratio of a mutual size differ also in mutually drawings is included.

The embodiment shown in the following exemplifies the device and method for materializing the technical idea of this invention, and this embodiment of the invention does not specify assignment of each component parts, etc. as the following. Various changes can be added to the technical idea of this invention in scope of claims.

First Embodiment

Ferroelectric Memory Device

As shown in FIG. 1, a ferroelectric memory device 10 according to a first embodiment of the present invention includes: a plurality of banks $18_{11}, 18_{12}, \ldots, 18_{n1}$, and $18_{n2}$, a peripheral circuit unit 14, and an SRAM interface (I/F) unit 16. The SRAM I/F unit 16 provides an interface compatible with SRAM for external, when connecting the plurality of banks $18_{11}, 18_{12}, \ldots, 18_{n1}$, and $18_{n2}$ with the external.

The peripheral circuit unit 14 shows other components except the SRAM I/F unit 16 and the plurality of banks $18_{11}, 18_{12}, \ldots, 18_{n1}$, and $18_{n2}$. The plurality of memory banks $18_{11}, 18_{12}, \ldots, 18_{n1}$, and $18_{n2}$ compose independent ferroelectric memories, respectively, and perform write-in, read-out, and holding of data in each bank unit.

Configuration Example 1 of Bank

Figure 2:
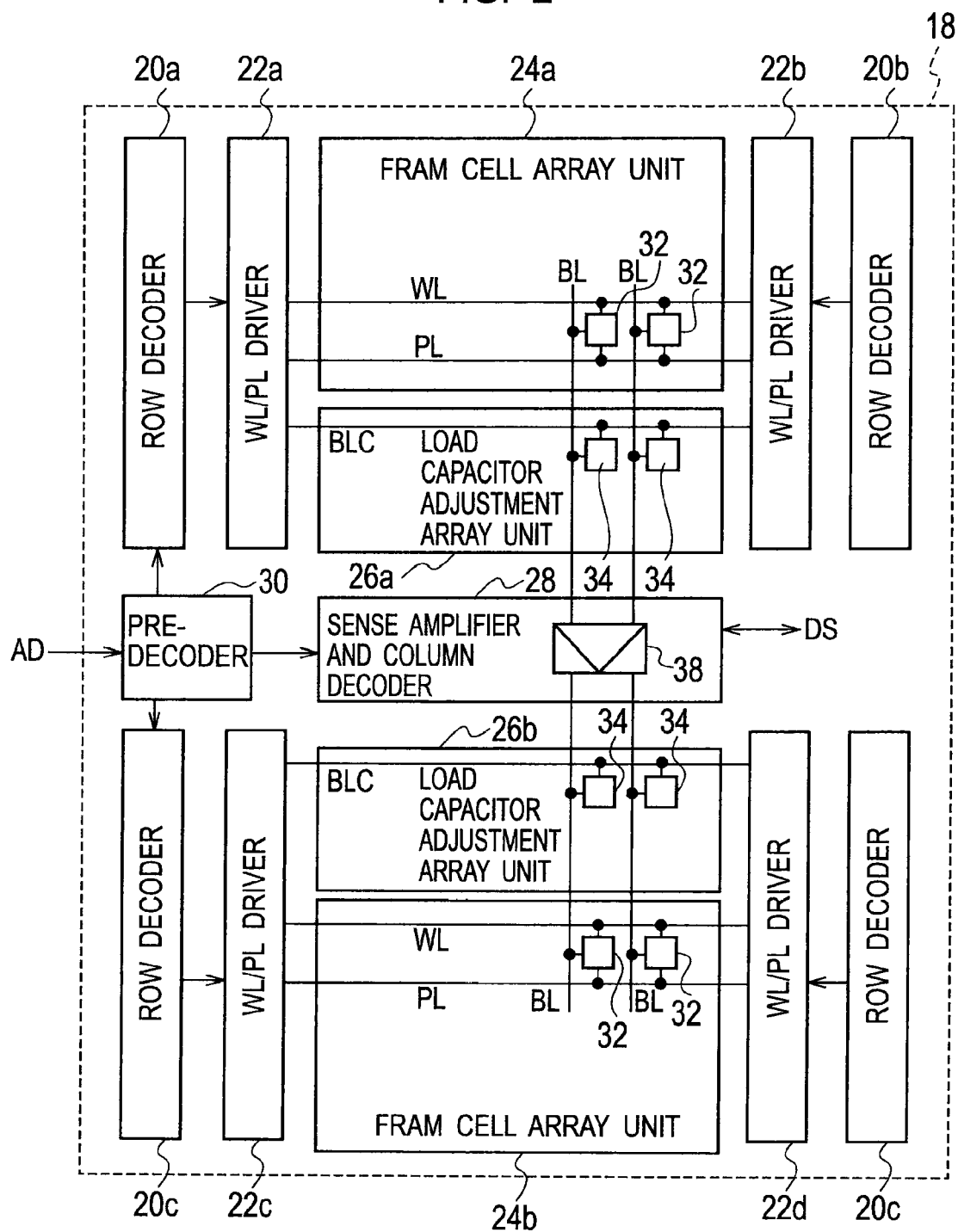
FIG. 2 A schematic block configuration diagram of one bank of the ferroelectric memory device according to the first embodiment of the present invention.

For example, as shown in FIG. 2, one bank 18 of the ferroelectric memory device 10 according to the first embodiment includes: FRAM cell array units 24a, 24b; load capacitor adjustment array units 26a, 26b disposed to be adjoining in the column direction for the FRAM cell array units 24a, 24b, respectively; a sense amplifier and column decoder 28 disposed in common to be adjoining in the column direction for the load capacitor adjustment array units 26a, 26b; word line/plate line (WL/PL) drivers 22a, 22b, and 22c, 22d disposed to be adjoining in the row direction for the FRAM cell array units 24a, 24b; row decoders 20a, 20b, and 20c, 20d disposed to be adjoining in the column direction for the word line/plate line (WL/PL) drivers 22a, 22b, and 22c, 22d, respectively; and a pre-decoder 30 which is disposed to be adjoining in the row decoders 20a, 20c and the sense amplifier and column decoder 28, and receives an address signal AD. The sense amplifier and column decoder 28 outputs a data signal DS.

A plurality of word line WL and a plurality of plate line PL are extended in the row direction from the word line/plate line (WL/PL) drivers 22a, 22b to the FRAM cell array unit 24a. Similarly, a plurality of word line WL and a plurality of plate line PL are extended in the row direction from the word line/plate line (WL/PL) drivers 22c, 22d to the FRAM cell array unit 24b.

Moreover, a bit line capacitor control line BLC is extended in the row direction from the word line/plate line (WL/PL) drivers 22a, 22b to the load capacitor adjustment array unit 26a. Similarly, a bit line capacitor control line BLC is extended in the row direction from the word line/plate line (WL/PL) drivers 22c, 22d to the load capacitor adjustment array unit 26b.

A plurality of bit lines BL in the FRAM cell array units 24a, 24b are extended in the column direction, and are connected to a sense amplifier 38 in the common sense amplifier and column decoder 28.

Ferroelectric memory cells 32 are disposed at matrix form in the FRAM cell array units 24a, 24b, and load capacitor adjustment cells 34 are disposed in the load capacitor adjustment array units 26a, 26b.

Although the FRAM cell array unit is divided into two in the example shown in FIG. 2, the number of the FRAM cell array units may be one. Also, although every two row decoders and every two WL/PL drivers disposed in the row direction are disposed for one FRAM cell array unit in the example shown in FIG. 2, the row decoder and the WL/PL driver may be one every.

Figure 3:
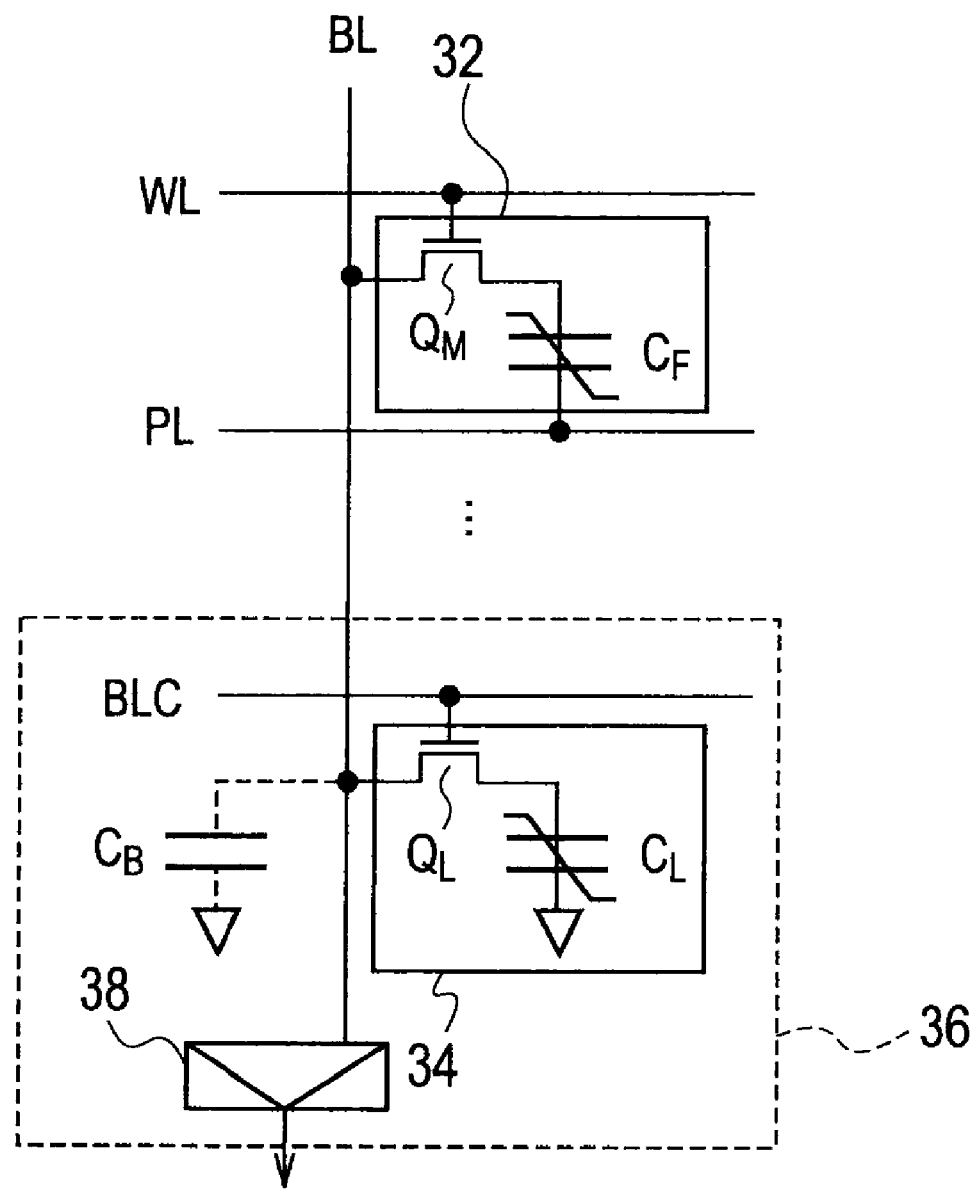
FIG. 3 A schematic circuit configuration chart of a ferroelectric memory cell and a load capacitor adjustment cell taken in a bit line BL of the ferroelectric memory device according to the first embodiment of the present invention.

In the ferroelectric memory device according to the present embodiment, as shown in FIG. 3, a schematic circuit configuration of the ferroelectric memory cell 32 and the load capacitor adjustment cell 34 which are taken in the bit line BL includes: the plurality of bit lines BL disposed in the column in the column direction; the plurality of word lines WL which intersectes perpendicularly with the bit line BL and are disposed in the row direction; the plurality of plate lines PL which intersectes perpendicularly with the bit line BL, and are disposed in the row direction; the bit line capacitor control line BLC which intersectes perpendicularly with the bit line BL and is disposed in the row direction; the ferroelectric memory cell 32 which is disposed at the intersection of the plurality of bit lines BL, the plurality of word lines WL and the plate lines PL, and is composed of a ferroelectric capacitor $C_F$ and a memory cell transistor $Q_M$; and the load capacitor adjustment cell 34 which is disposed at the intersection of the plurality of bit lines BL and the bit line capacitor control line BLC, and is composed of the load capacitor $C_L$ and the load capacitor adjustment transistor $Q_L$.

An electrode of one side of the ferroelectric capacitor $C_F$ is connected to the plate line PL. The electrode of another side of the ferroelectric capacitor $C_F$ is connected to a source of the memory cell transistor $Q_M$. A drain of the memory cell transistor $Q_M$ is connected to the bit line BL. A gate of the memory cell transistor $Q_M$ is connected to the word line WL.

An electrode of one side of the load capacitor $C_L$ is connected to ground potential. An electrode of another side of the load capacitor $C_L$ is connected to a source of the load capacitor adjustment transistor $Q_L$. A drain of the load capacitor adjustment transistor $Q_L$ is connected to the bit line BL. A gate of the load capacitor adjustment transistor $Q_L$ is connected to the bit line capacitor control line BLC.

The ferroelectric capacitor $C_F$ includes at least one ferroelectric thin film layer.

The data in the ferroelectric memory cell 32 is held by a quantity of electrical charge charged in the ferroelectric capacitor $C_F$ or a quantity of residual polarization electric charge inside the ferroelectric thin film layer.

In the ferroelectric memory device according to the present embodiment, as shown in FIG. 3, for the ferroelectric memory cell 32, the load capacitor switching unit 36 is disposed to adjust a capacitance value of the bit line BL.

As shown in FIG. 3, the load capacitor switching unit 36 is composed of the bit line capacitor control line BLC, the load capacitor adjustment cell 34 composed of the load capacitor $C_L$ and the load capacitor adjustment transistor $Q_L$, the sense amplifier 38 connected to the bit line BL, and the bit line capacitor $C_B$.

By setting the bit line capacitor control line BLC into high level, the load capacitor adjustment transistor $Q_L$ is in conductive state, and the capacitance value of bit line BL is increased to a large capacitor of $C_B+C_L$. On the other hand, by setting the bit line capacitor control line BLC into a low level, the load capacitor adjustment transistor $Q_L$ is in OFF state, and as for the capacitance value of the bit line BL, the state of the small capacitor of $C_B$ is maintained.

The load capacitor adjustment cell 34 can be composed of same structure as the ferroelectric memory cell 32 for hodling data. For example, the load capacitor $C_L$ can also be obtained by performing one or more parallel connection of the same structure as the ferroelectric memory cell 32 which is composed of the memory cell transistor $Q_M$ and the ferroelectric capacitor $C_F$. Therefore, since the load capacitor adjustment cell 34 is connected to BL via the load capacitor adjustment transistor $Q_L$ only at the time of the FRAM mode, the load capacitor adjustment cell 34 can simplify the configuration.

Configuration Example 2 of Bank

For example, as shown in FIG. 2, another detailed schematic block configuration example of one bank 18 of the ferroelectric memory device 10 according to the present embodiment includes: FRAM cell array units 25a, 25b; a common sense amplifier and column decoder 28 disposed to be adjoining in the column direction for the FRAM cell array units 25a, 25b; WL/PL drivers 22a, 22b disposed to be adjoining in the row direction for the FRAM cell array unit 25a; WL/PL drivers 22c, 22d disposed to be adjoining in the row direction for the FRAM cell array unit 25b; row decoders 20a, 20b disposed to be adjoining in the column direction for the WL/PL drivers 22a, 22b; and row decoders 20c, 20d disposed to be adjoining in the column direction for the WL/PL drivers 22c, 22d. The bank 18 further includes a pre-decoder 30a which is disposed to be adjoining in the row decoders 20a, 20c and the sense amplifier and column decoder 28, and receives an address signal AD. The bank 18 further includes a pre-decoder 30b which is disposed to be adjoining in the row decoders 20b, 20d and the sense amplifier and column decoder 28, and receives the address signal AD.

The sense amplifier and column decoder 28 is connected to an I/O control unit 40. A memory control sequencer 42 is further disposed in the bank 18. The FRAM cell array units 25a and 25b achieves easily a configuration which includes the load capacitor adjustment array units 26a and 26b inside by composing the load capacitor adjustment cell 34 with same structure as the ferroelectric memory cell 32 for hodling data. Also, process variations at the time of production can be reduced by applying the load capacitor adjustment cell 34 into the same structure as the ferroelectric memory cell 32. However, the configuration of the load capacitor adjustment cell 34 may not be limited to above configuration, and it may apply the load capacitor adjustment cell 34 into a configuration different from the ferroelectric memory cell 32.

An address signal AD [15:10], a clock signal CLK, a read-out request signal RD, a write-in request signal WR, and a refresh request signal REF are input into the memory control sequencer 42.

An output control signal OE, an input control signal WE, a sense amplifier control signal SAE, a plate line control signal PLC, a word line control signal WLC, and a bit line capacitor control signal BLCC are output from the memory control sequencer 42.

A plurality of word lines WLT [127:0], a plurality of plate lines PLT [127:0], and a bit line capacitor control line BLC [2:0] are extended in the row direction from the WL/PL drivers 22a, 22b to the FRAM cell array unit 25a. The bit line capacitor control signal BLC [2:0] is connected to the load capacitor adjustment array unit 26a in the FRAM cell array unit 25a.

Similarly, a plurality of word lines WLB [127:0], a plurality of plate lines PLB [127:0], and a bit line capacitor control line BLC [2:0] are extended in the row direction from the WL/PL drivers 42c, 22d to the FRAM cell array unit 25b. The bit line capacitor control signal BLC [2:0] is connected to the load capacitor adjustment array unit 26b in the FRAM cell array unit 25b.

A plurality of bit lines BLT [63:0] and #BLT [63:0] in the FRAM cell array unit 25a are extended in the column direction, and are connected to a sense amplifier in the sense amplifier and column decoder 28.

Similarly, a plurality of bit lines BLB [63:0] and #BLB [63:0] in the FRAM cell array unit 44b are extended in the column direction, and are connected to the sense amplifier of the sense amplifier and column decoder 28.

The ferroelectric memory cells 32 are disposed at matrix form in the FRAM cell array units 25a, 25b, and the load capacitor adjustment cells 34 are disposed in the load capacitor adjustment array units 26a, 26b in the FRAM cell array units 25a, 25b, respectively.

A plate line control signal PLC, a word line control signal WLC, and a bit line capacitor control signal BLCC [2:0] are input into the row decoders 20a to 20d.

A row address signal AR [7:0] is input into the row decoders 20a, 20c from the pre-decoder 30a, and a row address signal AR [7:0] is similarly input into the row decoder 20b, 20d from the pre-decoder 30b.

An output control signal OE, an input control signal WE, and a write-in data signal WDL [15:0] are input into the I/O control unit 40.

A read-out data signal RDL [15:0] is output from the I/O control unit 40.

Figure 4:
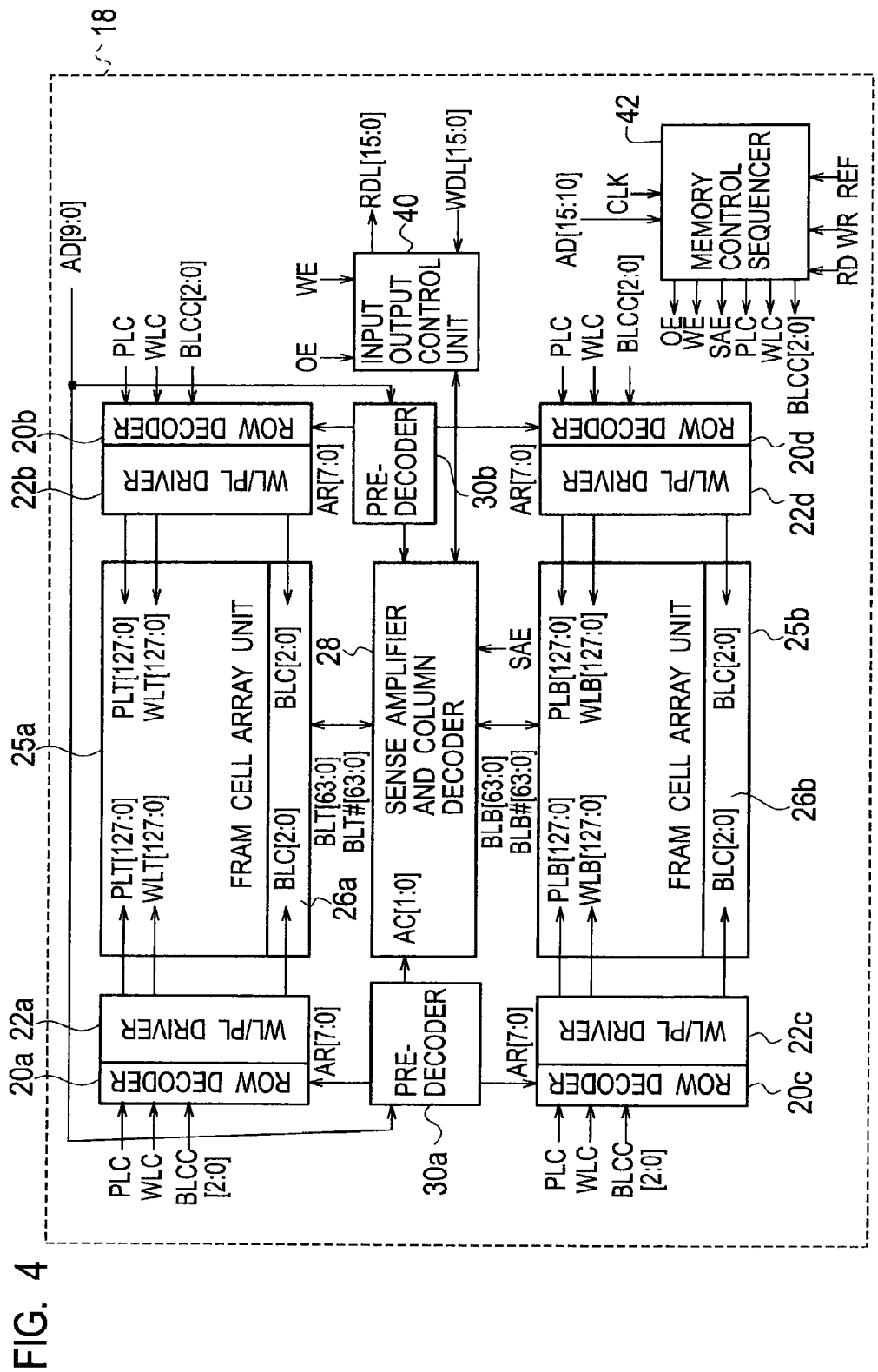
FIG. 4 Another detailed schematic block configuration diagram of one bank of the ferroelectric memory device according to the first embodiment of the present invention.
Figure 5:
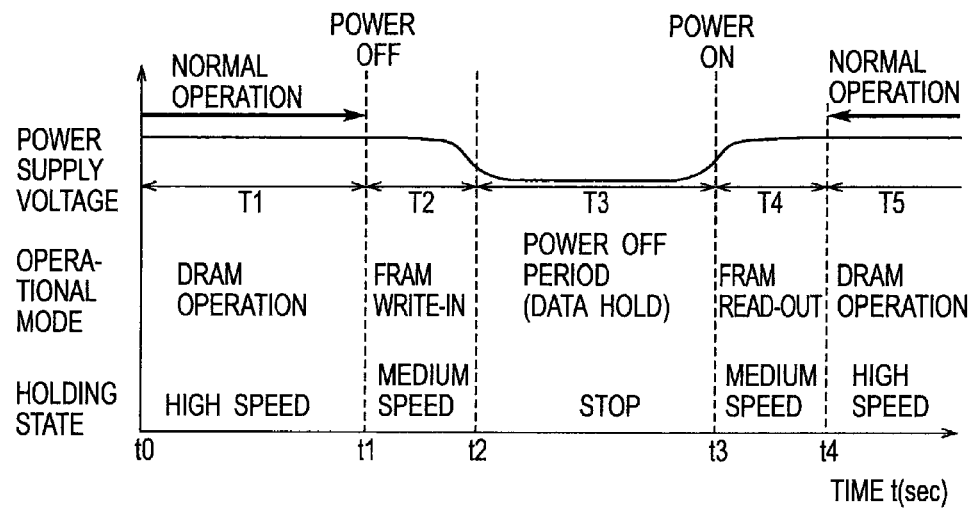
FIG. 5 A timing chart for explaining a schematic of operation of the ferroelectric memory device according to the first embodiment of the present invention.

In the configuration example 2 of the bank 18 of FIG. 4, a schematic circuit configuration of the ferroelectric memory cell 32 and the load capacitor adjustment cell 34 taken in the bit line BL is similarly expressed as FIG. 3. For the ferroelectric memory cell 32, the load capacitor switching unit 36 is disposed to adjust the capacitance value of the bit line BL.

The load capacitor adjustment cell 34 is composed of same structure as the ferroelectric memory cell 32 for hodling data, and obtains a load capacitor CL by performing parallel connection of the plurality of ferroelectric memory cells 32 which are composed of a memory cell transistor $Q_M$ and a ferroelectric capacitor $C_F$.

In the configuration example 2 of one bank 18 shown in FIG. 4, although the FRAM cell array unit is divided into two, the number of the FRAM cell array units may be one. In the configuration of one bank 18 shown in FIG. 4, although every two row decoders and every two WL/PL drivers disposed in the row direction are disposed for one FRAM cell array unit, the row decoder and the WL/PL driver may be one every.

(Operation Timing Chart)

A schematic of operation of the ferroelectric memory device according to the first embodiment will be explained using a timing chart shown in FIG. 7.

(a) Firstly, a period T1 during the timing t0 to t1 is in a normal operation state. As for the ferroelectric memory cell, polarization inversion does not occur, and the variation ΔQ of the charge quantity at the time of random access is also small since it is a small capacitor drive. Therefore, a high speed operation by DRAM operational mode is possible. The random access operation at the time of DRAM write-in and read-out of a holding state of data "1" and data "0" are executable at high speed.

(b) Next, a control signal of power OFF is received in the timing t1.

(c) Next, a period T2 of the timing t1 to t2 is in an FRAM write-in state. As for the ferroelectric memory cell, the polarization inversion occurs, and the variation ΔQ of the charge quantity at the time of FRAM write-in is also large since it is a large capacitor drive. Therefore, the medium speed operation by the FRAM write-in operational mode is possible.

(d) Next, a period T3 of the timing t2 to t3 is a power OFF period. The ferroelectric memory cell holds data "1" written in by quantity of electrically charged up charges or data "0" written by polarization inversion, in the FRAM write-in operation mode.

(e) Next, a period T4 of the timing t3 to t4 is in an FRAM read-out state. In the FRAM read-out operation mode, data "1" written with the quantity of electrically charged up charges is read in the DRAM mode, or data "0" written by the polarization inversion is read in the FRAM read-out operation mode. In the case of read-out by the FRAM read-out operation mode, it is read from the polarization inversion state by large capacitor drive. The variation ΔQ of the charge quantity at the time of the FRAM read-out is also large. Therefore, the medium speed operation by the FRAM operational mode is possible during the period T4 of the timing t3 to t4.

(f) Next, a period T5 after the timing t4 is in the normal operation state. As for the ferroelectric memory cell, polarization inversion does not occur, and the variation ΔQ of charge quantity is also small since it is a small capacitor drive. Therefore, the high speed operation by the DRAM operational mode is possible. On the other hand, the ferroelectric memory cell can also be turned to the state of holding data also as quantity of residual polarization electric charge, not only as quantity of electrically charged up charges. In this case, data is applied non-volatilizing and read-out by the DRAM operational mode is also possible.

(DRAM Read-Out Operation)

Figure 6:
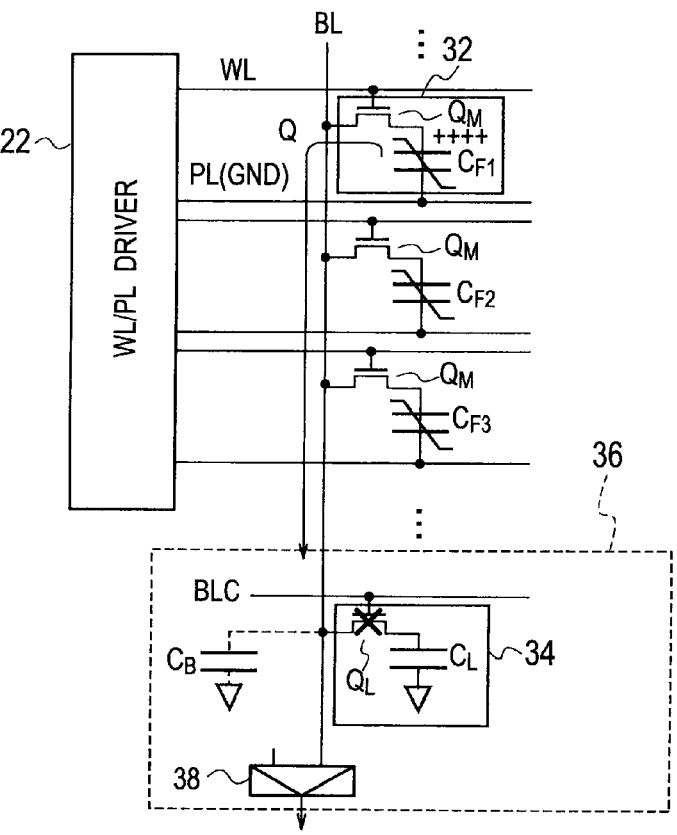
FIG. 6 A circuit configuration chart for explaining a read-out operation of the ferroelectric memory cell at the time of normal operation mode (DRAM operational mode), in the ferroelectric memory device according to the first embodiment of the present invention.

In the ferroelectric memory device according to the first embodiment, the read-out operation of the ferroelectric memory cell at the time of the normal operation mode (DRAM operational mode) will be explained with reference to a circuit configuration shown in FIG. 6.

The ferroelectric memory cells 32 connected on the same bit line BL include memory cell transistors $Q_M$ and ferroelectric capacitors $C_{F1}$, $C_{F2}$, and $C_{F3}$, ..., respectively. The value of the ferroelectric capacitors $C_{F1}$, $C_{F2}$, $C_{F3}$, ... is small when the polarization inversion state does not occur, and is large when the polarization inversion state does occurring. That is, since the quantity of stored charge is large when the polarization inversion condition occurs corresponding to the operational point on the hysteresis characteristic of the ferroelectric capacitor, the read-out operation is time-consuming operation mode (FRAM read-out mode), and since the quantity of stored charge is small when the polarization inversion condition does not occur, the read-out operation mode can be performed at high speed (DRAM read-out mode).

In the DRAM read-out operation, a part having a small capacitor of the ferroelectric capacitor is used in the operational point on the hysteresis characteristic of the ferroelectric capacitor.

When the word line WL is turned to high level in the condition that the plate line PL is set into a ground level (GND), the electric charge Q stored in the ferroelectric capacitor $C_{F1}$ is swept out on the bit line BL. At the time of the DRAM read-out operation, since the bit line capacitor control line BLC is turned to the low level, the load capacitor adjustment cell 34 in the load capacitor switching unit 36 does not work.

The electric charge Q swept out on the bit line BL charges the bit line capacitor $C_B$, and the electrical change is amplified via the sense amplifier 38.

Figure 7:
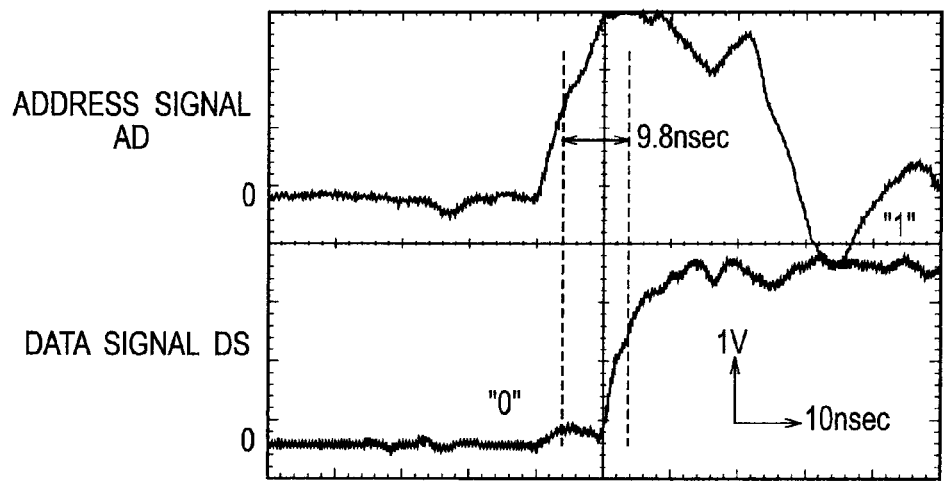
FIG. 7 A diagram for explaining an access time expressed as a time delay of data signal DS for an address signal AD at the time of the normal operation mode (DRAM operational mode), in the ferroelectric memory device according to the first embodiment of the present invention.

The access time of the ferroelectric memory device according to the first embodiment is expressed as a time delay of the data signal DS for the address signal AD at the time of the normal operation mode (DRAM operational mode), as shown in FIG. 7.

For example, in the ferroelectric memory device according to the first embodiment fabricated by the 0.35 μm CMOS technology, the access time at the time of the normal operation mode is about 9.8 ns as a result of operating the power supply voltage with 3.3V. Since the access time at the time of the normal operation mode in the conventional FRAM is about 75 ns, the access time of the same grade as SRAM can be obtained in the ferroelectric memory device according to the first embodiment.

Figure 8:
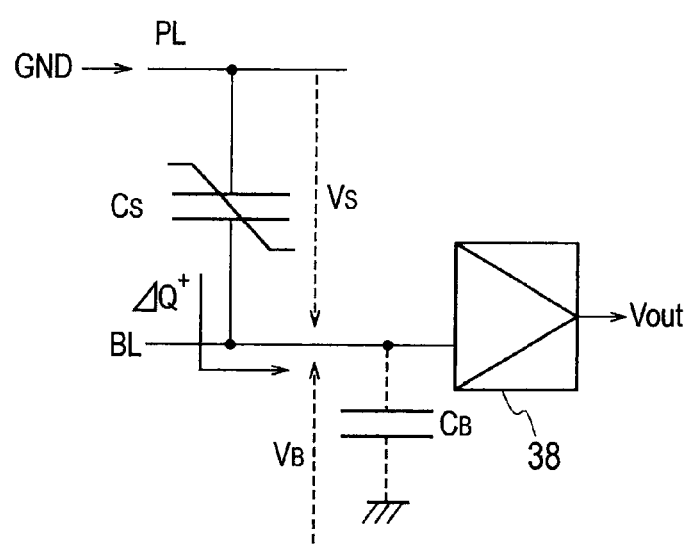
FIG. 8 A schematic circuit configuration diagram for explaining a DRAM read-out operation of the ferroelectric memory cell at the time of the normal operation mode (DRAM operational mode) of the ferroelectric memory device according to the first embodiment of the present invention.
Figure 9:
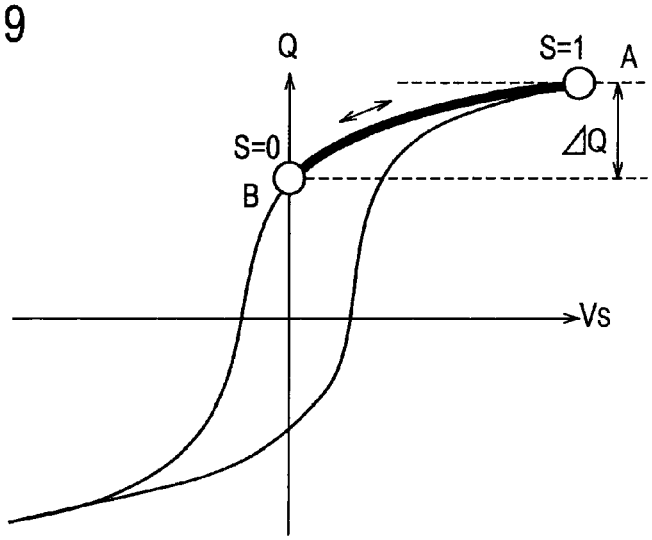
FIG. 9 An operation explanatory diagram on hysteresis characteristic for explaining the DRAM read-out operation of the ferroelectric memory cell at the time of the normal operation mode (DRAM operational mode) of the ferroelectric memory device according to the first embodiment of the present invention.

The DRAM read-out operation will be explained using a schematic circuit configuration chart showing in FIG. 8 and an operation explanatory diagram on the hysteresis characteristic shown in FIG. 9.

In the DRAM operational mode, by turning the bit line capacitor control line BLC into the low level, the load capacitor adjustment transistor $Q_L$ of the load capacitor adjustment cell 34 is turned to OFF state, and, as for the capacitance value of bit line BL, the state of the small capacitor of $C_B$ is maintained. In this case, as shown in FIG. 9, the ferroelectric capacitor of the ferroelectric memory cell 32 is in a state of the operational points A and B on the hysteresis characteristic. That is, when "1" is stored, it is in the state of S=1 (operational point A). On the other hand, when "0" is stored, it is in the state of S=0 (operational point B). Quantity of variations ΔQ of the electric charge between the operational point A and the operational point B is small.

When the value of the ferroelectric capacitor $C_F$ in DRAM operational mode is set to as $C_S$, and the voltage stored in the ferroelectric capacitor $C_F$ is set to as $V_S$, the voltage $V_B$ of the bit line BL denoted by the voltage $V_B = \Delta Q/(C_S + C_B) = C_S \cdot V_S/(C_S + C_B)$ of the bit line BL is decided based on the size of $C_S$ and $C_B$ according to the charge conservation principle of $\Delta Q = C_S \cdot V_S$. The one where $C_B$ is smaller has large signal amplitude, and is suitable for high-speed operation.

(FRAM Read-Out Operation)

Figure 10:
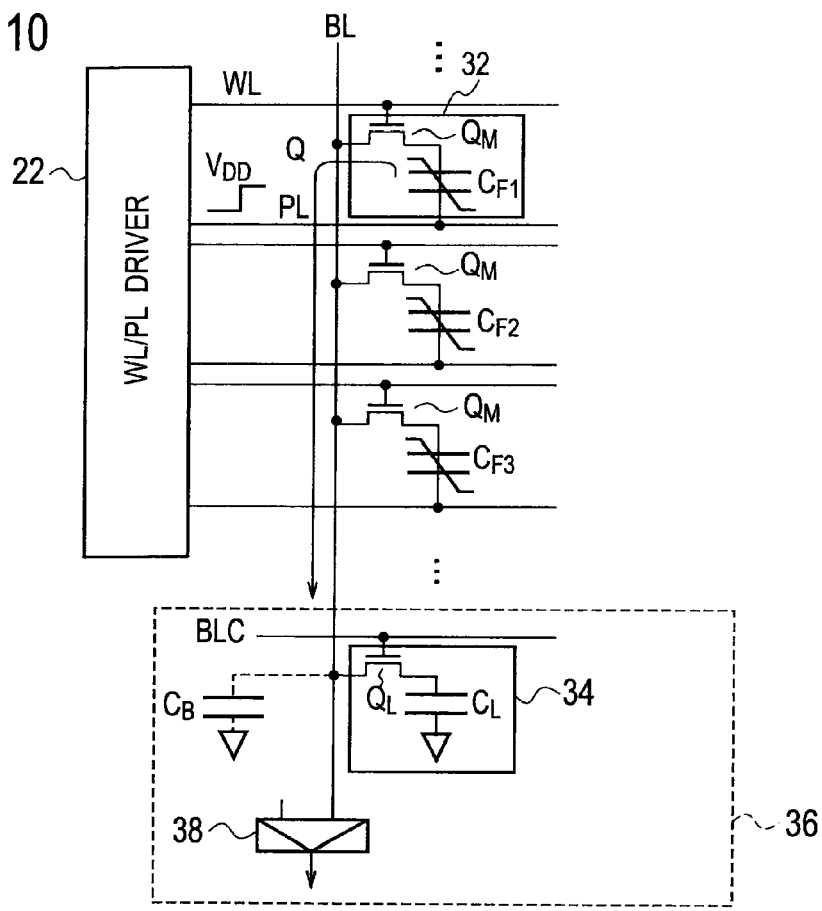
FIG. 10 An operation example of the ferroelectric memory device according to the first embodiment of the present invention, and a circuit configuration chart for explanation of operation of the ferroelectric memory cell at the time of power ON operation mode (FRAM operational mode).

In the ferroelectric memory device according to the first embodiment, the read-out operation of the ferroelectric memory cell of the FRAM operational mode will be explained with reference to a circuit configuration shown in FIG. 10.

In the FRAM read-out operation, a part having a large capacitor variation of the ferroelectric capacitor is used in the operational point on the hysteresis characteristic of the ferroelectric capacitor.

When the plate line PL is turned to the high level in the condition that the word line WL is turned to the high level, the electric charge Q stored in the ferroelectric capacitor $C_{F1}$ is swept out on the bit line BL. Since the bit line capacitor control line BLC is turned to the high level in the FRAM read-out mode as for the load capacitor adjustment cell 34 in the load capacitor switching unit 36, the electric charge Q swept out on the bit line BL charges the increased bit line capacitor $(C_B+C_L)$, and the electrical change is amplified via the sense amplifier 38.

Figure 11:
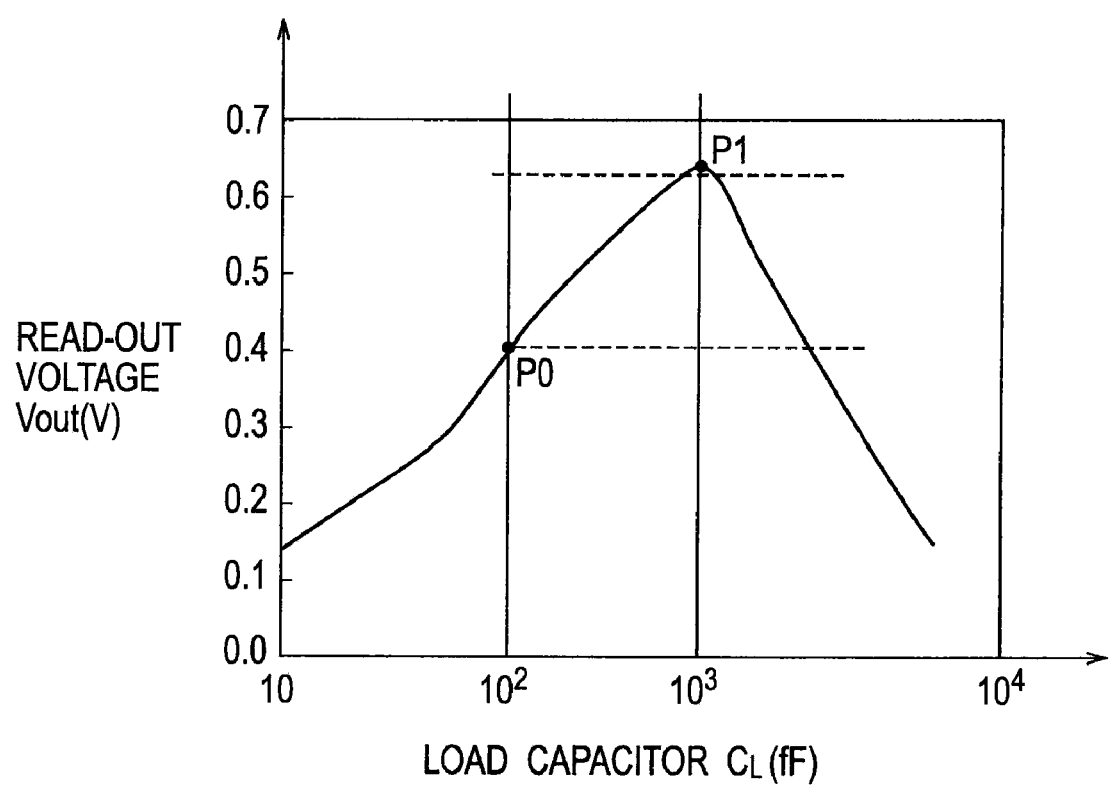
FIG. 11 An operation example of the ferroelectric memory device according to the first embodiment of the present invention, and a simulation result of load capacitor dependence of a data read-out voltage of the ferroelectric memory cell at the time of the FRAM operational mode.

FIG. 11 shows a simulation result of the relation between the read-out voltage $V_{out}$ and the load capacitor $C_L$ in the FRAM read-out mode. When the bit line capacitor is only $C_B$, the read-out voltage $V_{out}$ is about 0.40 V (DRAM read-out mode), as shown in P0. On the other hand, when the load capacitor adjustment cell 34 is operated, the load capacitor $C_L$ is added, and the bit line capacitor is increased to $(C_B+C_L)$, the read-out voltage $V_{out}$ is set to about 0.63 V, and the signal quantity rises by about 1.5 times (FRAM read-out mode). In the FRAM operational mode, the signal quantity of the read-out voltage $V_{out}$ is securable by adjusting the load capacitor $C_L$.

Figure 12:
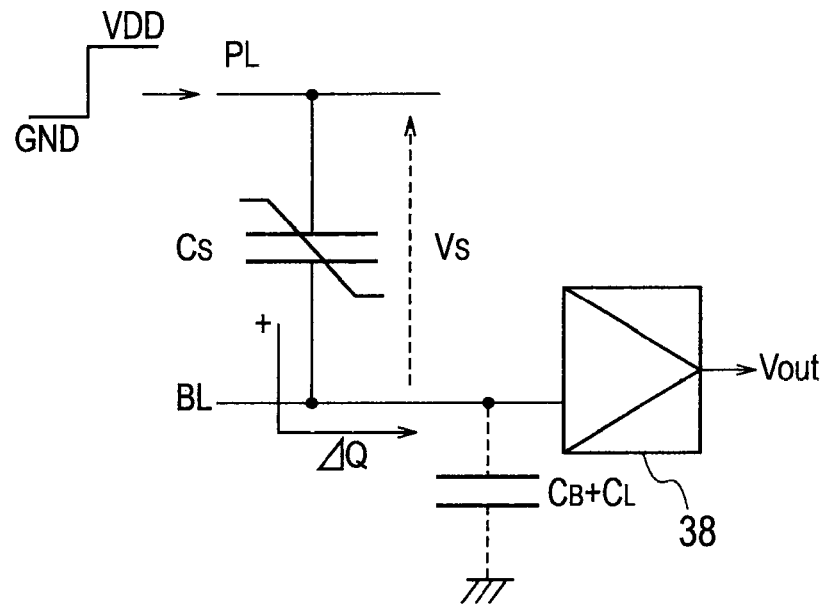
FIG. 12 A schematic circuit configuration diagram for explaining an FRAM read-out operation of the ferroelectric memory cell at the time of the FRAM operational mode of the ferroelectric memory device according to the first embodiment of the present invention.
Figure 13:
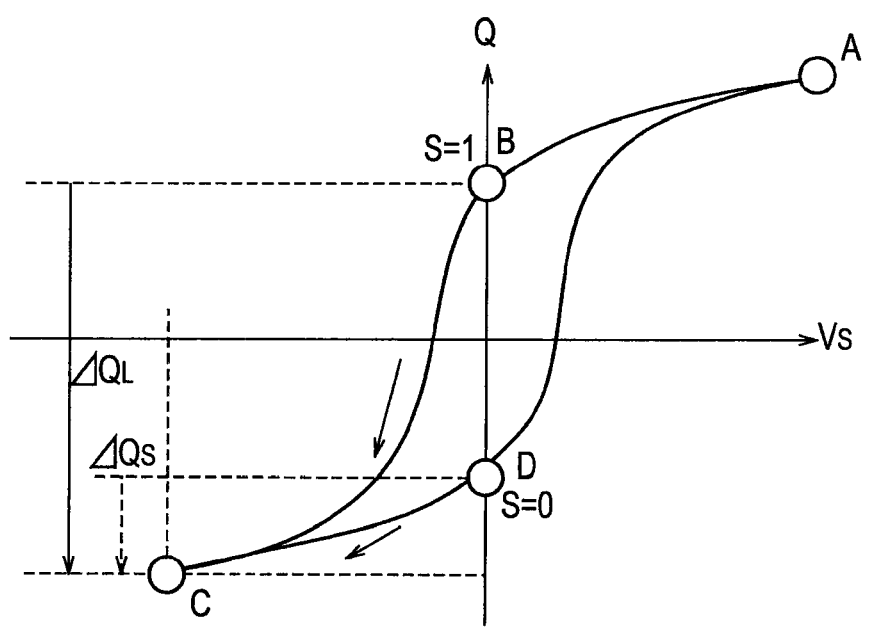
FIG. 13 An operation explanatory diagram on the hysteresis characteristic for explaining the FRAM read-out operation of the ferroelectric memory cell at the time of the FRAM operational mode of the ferroelectric memory device according to the first embodiment of the present invention.

The DRAM read-out operation will be explained using a schematic circuit configuration chart showing in FIG. 12 and an operation explanatory diagram on the hysteresis characteristic shown in FIG. 13.

In the FRAM read-out operation, by turning the bit line capacitor control line BLC to the high level, the load capacitor adjustment transistor $Q_L$ of the load capacitor adjustment cell 34 is in ON state, and the capacitance value of bit line BL is adjusted to the large capacitor state of $(C_B+C_L)$. In this case, as shown in FIG. 13, the ferroelectric capacitor of the ferroelectric memory cell 32 is in the state of the operational points B and D on the hysteresis characteristic. That is, when "1" is stored, it is in the state of S=1 (operational point B). On the other hand, when "0" is stored, it is in the state of S=0 (operational point D). The variation of the electric charge in the FRAM read-out operation of data "1" is expressed by $\Delta Q_L$, and the variation of the electric charge in the FRAM read-out operation of data "0" is expressed by $\Delta Q_S$. The variation $(\Delta Q_L - \Delta Q_S)$ of the electric charge between the operational point B and the operational point D is large.

According to the charge conservation principle of $\Delta Q = C_S \cdot V_S$, when the voltage of the plate line PL rises from the ground potential (GND) to VDD, the following equation is satisfied:

$$\Delta Q = C_S \cdot V_S = C_B \cdot (V_{DD} - V_S)$$

where $C_S$ is the value of the ferroelectric capacitor $C_F$ in the FRAM read-out operation mode, and $V_S$ is the voltage stored in the ferroelectric capacitor $C_F$. Therefore, voltage $V_S = C_S \cdot V_{DD}/(C_S+C_B)$ stored in the ferroelectric capacitor $C_F$ is satisfied. Herein, the equation $V_S = (C_B+C_L) \cdot V_{DD}/(C_S+C_B+C_L)$ is satisfied by turning the load capacitor adjustment transistor $Q_L$ to ON state and adjusting the capacitance value of bit line BL to the large capacitor state of $(C_B+C_L)$.

In the FRAM read-out operation mode, the read-out operation is performed by applying the voltage to the ferroelectric capacitor $C_F$ and considering the difference of output electric charges. The large bit line capacitor $C_B$ is needed in order to apply a sufficient voltage for the ferroelectric capacitor $C_F$, and a large bit line capacitor can be secured by turning the load capacitor adjustment transistor $Q_L$ to ON state and adjusting the capacitance value of the bit line BL to the large capacitor state of $(C_B+C_L)$.

(Refresh Operation)

Figure 14:
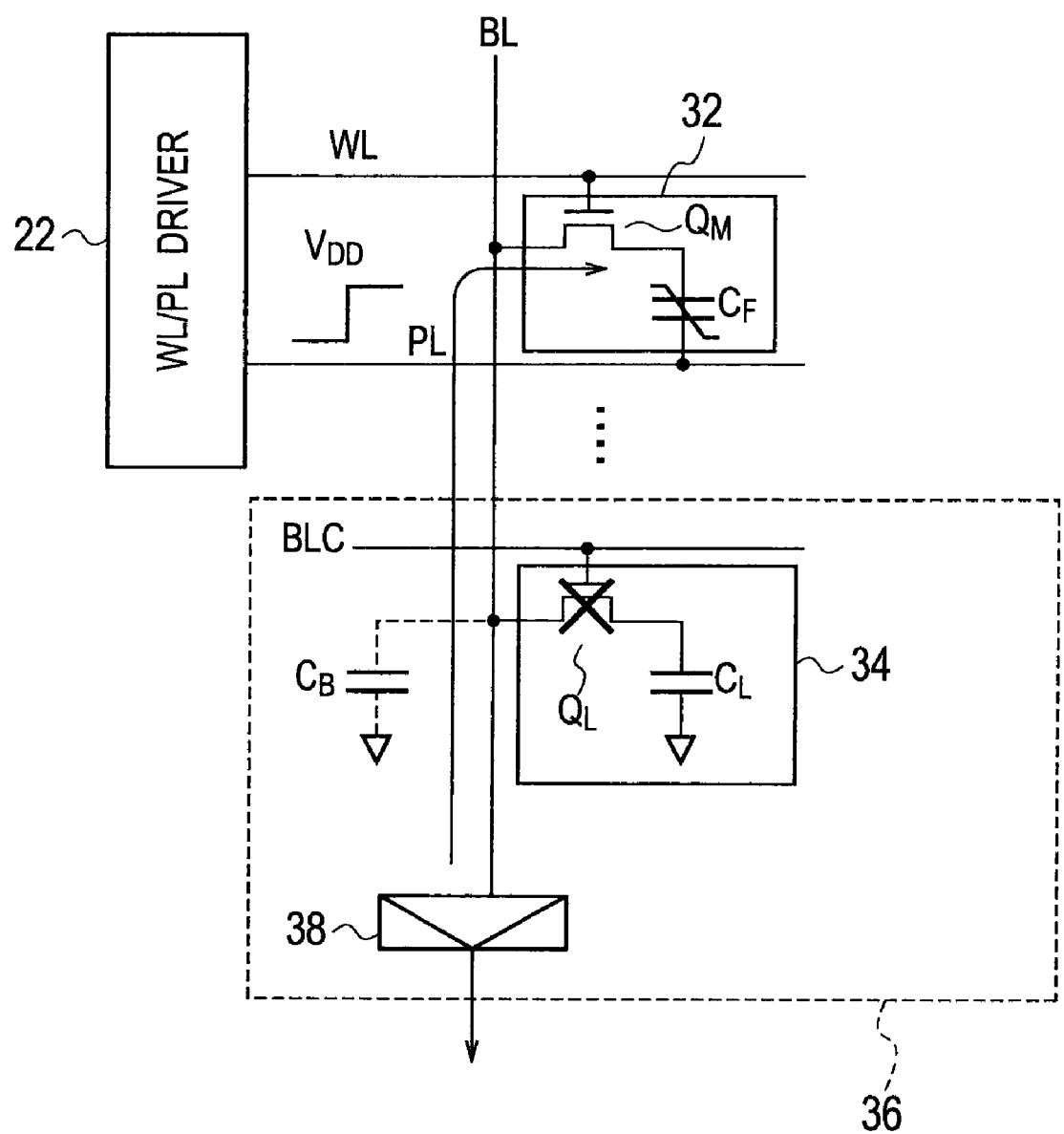
FIG. 14 An operation example of the ferroelectric memory device according to the first embodiment of the present invention, and a circuit configuration chart for explaining an operation of the ferroelectric memory cell at the time of refresh operation.
Figure 15:
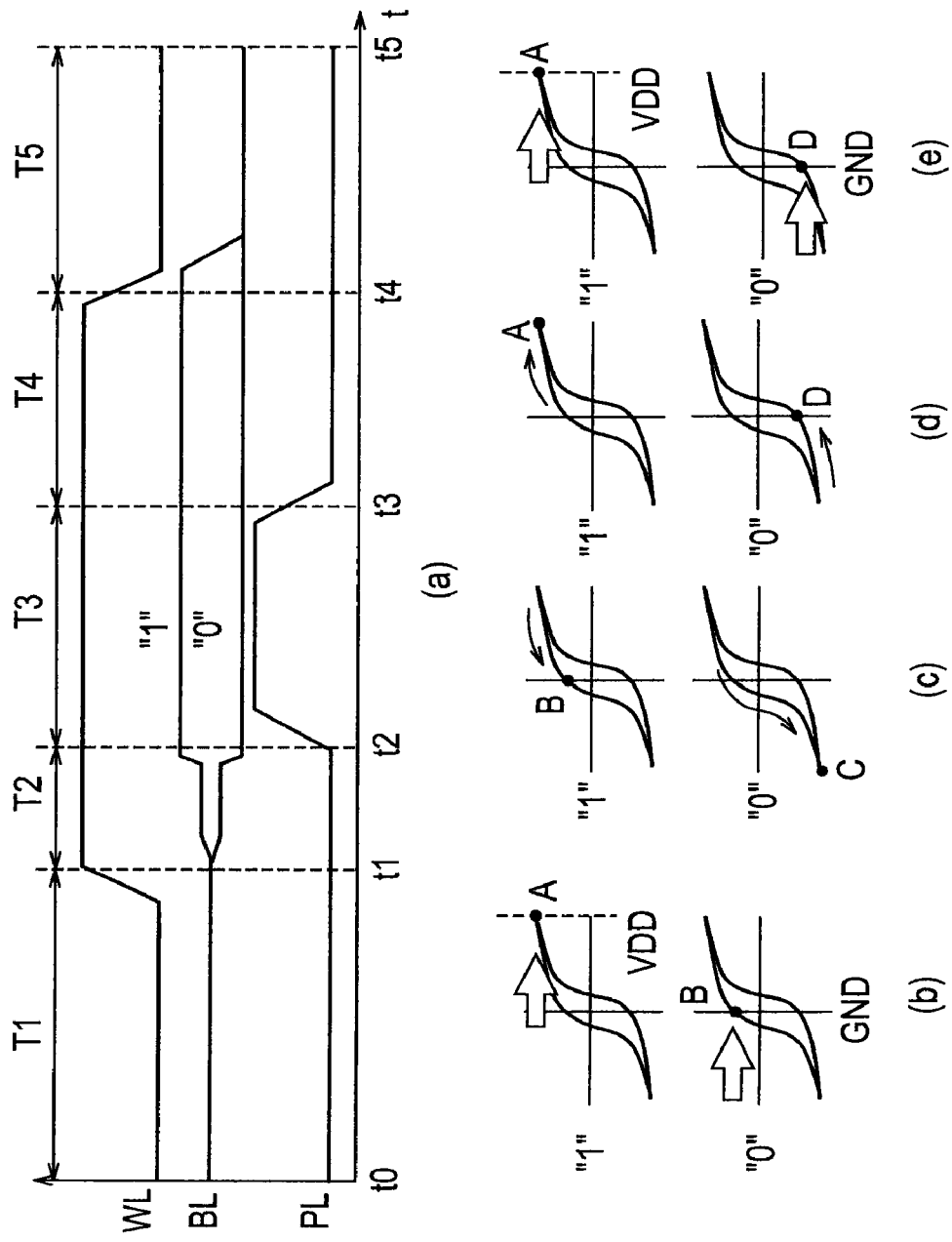
FIG. 15 An operation example of the ferroelectric memory device according to the first embodiment of the present invention, (a) An operation wave form chart of the ferroelectric memory cell at the time of a refresh operation, (b) An operation explanatory diagram on hysteresis characteristic at the time of a normal operation mode (DRAM operational mode) which holds data only with quantity of electrically charged up charges, (c) An operation explanatory diagram on the hysteresis characteristic at the time of a data write-in operation mode (FRAM operational mode), (d) An operation explanatory diagram on the hysteresis characteristic at the time of the data write-in operation mode (FRAM operational mode), and (e) an operation explanatory diagram on the hysteresis characteristic at the time of the normal operation mode (DRAM operational mode) which holds data by both of the quantity of electrically charged up charges and the quantity of residual polarization electric charge.

In the ferroelectric memory device according to the first embodiment, a refresh operation of the ferroelectric memory cell will be explained using a circuit configuration shown in FIG. 14, and an operation waveform shown in FIG. 15(a). Moreover, an operation on the hysteresis characteristic of the ferroelectric memory cell for holding data only with the quantity of electrically charged up charges is expressed as shown in FIG. 15(b), an operation on the hysteresis characteristic at the time of the data write-in operation mode (FRAM operational mode) is expressed as shown in FIG. 15(c) and FIG. 15(d), and an operation on the hysteresis characteristic for holding data with both the quantity of electrically charged up charges and the quantity of residual polarization electric charge is expressed as shown in FIG. 15(e).

(a) Firstly, a period T1 of the timing t0 to t1 indicates a data hold state. The storage state of data "1" is in the operational point A where $V_{DD}$ is applied, on the hysteresis characteristic. On the other hand, the storage state of data "0" is in the operational point B where the ground potential GND is applied, on the hysteresis characteristic.

(b) Next, a period T2 of the timing t1 to t2 indicates the DRAM read-out operation. When high level voltage is applied to the word line WL in the case where the potential of the plate line PL is a state of a ground level, a minute electrical change occurs on the bit line BL, according to the storage state of the data "0" in the operational point B and the storage state of the data "1" in the operational point A, as indicated in the period T1 of the timing t1 to t2, on the hysteresis characteristic.

(c) Next, a period T3 of the timing t2 to t3 indicates the data write-in operation of the FRAM operational mode. When the high level voltage $V_{DD}$ is applied to the plate line PL in the condition that the high level voltage is applied to the word line WL, as shown in FIG. 14, the state of data "1" is shifted to the operational point B of the GND level from the operational point A where the voltage $V_{DD}$ is applied. On the other hand, the state of data "0" is shifted from the operational point B of the GND level to the operational point C where the negative voltage-$V_{DD}$ is applied. Since the case of the shift from the operational point A to the operational point B corresponds to the DRAM write mode and the capacitor of the ferroelectric memory cell is small, the electrical change is small, the variations of the electric charge is also small, and then high speed operation is possible. On the other hand, since the case of the shift from the operational point B to the operational point C corresponds to the FRAM write mode and the capacitor of the ferroelectric memory cell is large, the electrical change is large, the variations of the electric charge is also large, and then the data write-in requires considerable time.

(d) Next, a period T4 of the timing t3 to t4 also indicates the data write-in operation state of the FRAM operational mode. When the high level voltage $V_{DD}$ applied to the plate line PL is returned to the GND in the condition that the high level voltage is applied to the word line WL as shown in FIG. 15(a), the state of data "1" is shifted from the operational point B of the GND level to the operational point A where the voltage $V_{DD}$ is applied as shown in FIG. 15(d). On the other hand, the state of data "0" is shifted to the operational point D of the GND level from the operational point C where the negative voltage-$V_{DD}$ is applied. Since the capacitor of the ferroelectric memory cell is small in the case of the shift to the operational point A from the operational point B, the electrical change is small, the variations of the electric charge is also small, and then high speed operation is possible. On the other hand, since the capacitor of the ferroelectric memory cell is small also in the case of the shift to the operational point D from the operational point C, the electrical change is small, the variations of the electric charge is also small, and then high speed operation is possible.

(e) Next, a period T5 of the timing t4 to t5 indicates the data hold state. The storage state of data "1" is in the operational point A where the $V_{DD}$ is applied, on the hysteresis characteristic of the ferroelectric memory cell. On the other hand, the storage state of data "0" is in the operational point D where the ground potential GND is applied, on the hysteresis characteristic of the ferroelectric memory cell.

Thus, it is possible to hold the data during a period T1 of the timing t0 to t1 only by the quantity of electrically charged up charges. On the other hand, it is possible to hold the data during a period T5 of the timing t4 to t5 by both of the quantity of electrically charged up charges and the quantity of residual polarization electric charge. It is turning to the state of holding data also as the residual polarization, while refreshing the data currently held as the quantity of electrically charged up charges.

(Operation Timing Chart of One Bank of Ferroelectric Memory Device)

As one bank of the ferroelectric memory device according to the first embodiment, an operation timing chart of the configuration example 2 of the bank shown in FIG. 4 is expressed as shown in FIG. 16.

Data Hold (a) First of all, a period U1 of the timing t0 to t1 indicates the data hold state at the time of the normal operation mode. As shown in FIG. 15(b), the storage state of data "1" is in the operational point A where $V_{DD}$ is applied, on the hysteresis characteristic. On the other hand, the storage state of data "0" is in the operational point B where the ground potential GND is applied, on the hysteresis characteristic of the ferroelectric memory cell.

DRAM Read-Out Operation

In the period U2 of the timing t1 to t5, full lines show the data read-out operation of the DRAM operational mode.

(b) In the timing t1, the address signal AD is supplied, and the read-out request signal RD is turned to high level at the same time.

(c) Next, in the timing t2, the word line control signal WLC is turned ON, and the potential of the word line WL is turned to the high level. Here, the potential of the plate line PL is a state of a ground level and high level voltage is applied to the word line WL, and thereby a minute electrical change occurs in the bit lines BL and BL# as shown by the full lines of the period during the timing t2 to t3, according to the storage state of the data "1" in the operational point A where the $V_{DD}$ is applied and the storage state of the data "0" in the operational point B where the ground potential GND is applied, on the hysteresis characteristic.

(d) Next, in the timing t3, when the sense amplifier control signal SAE is turned ON, the voltage level of the potential of bit lines BL and BL# is settled by latchup operation of the sense amplifier. The voltage which appears on the bit line BL# is reference voltage.

(e) Next, in the timing t4, when the output control signal OE is turned ON, the read-out data signal RDL is output from the I/O control unit 40 shown in FIG. 4.

DRAM Write-In Operation

In the period U2 of the timing t1 to t5, dotted lines indicate the data write-in operation of the DRAM operational mode.

(f) In the timing t1, the address signal AD is supplied, and the read-out/write-in request signal WR is turned to the low level at the same time.

(g) Next, in the timing t2, the input control signal WE is turned ON, and the word line control signal WLC is turned ON, and the potential of the word line WL turned to the high level. Here, the potential of the plate line PL is the ground level, and a large electrical change occurs on the bit lines BL and BL# with the DRAM write-in operation by applying the high level voltage to the word line WL, as shown with dotted lines in a period during the timing t2 to t3.

(h) Next, in the timing t3, when the sense amplifier control signal SAE is turned ON, the voltage level of the potential of the bit lines BL and BL# is settled by the latchup operation of the sense amplifier. The voltage which appears on the bit line BL# is reference voltage.

Data Refresh Operation of FRAM Operational Mode

A period U3 of the timing t6 to t13 indicates the data refresh operation of the FRAM operational mode.

(i) In the timing t6, the refresh request signal REF is turned ON.

(j) Next, in the timing t7, the word line control signal WLC is turned ON, and the potential of the word line WL is turned to the high level. Here, the potential of the plate line PL is the ground level, and a minute electrical change occurs on bit lines BL and BL# by applying the high level voltage to the word line WL, as shown a period during the timing t7 to t8.

(k) Next, in the timing t8, when the sense amplifier control signal SAE is turned ON, the voltage level of the potential of the bit lines BL and BL# is settled by the latchup operation of the sense amplifier. The voltage which appears on the bit line BLn is reference voltage.

(l) A period during the timing t9 to t11 indicates the data write-in operation of the FRAM operational mode. When the high level voltage $V_{DD}$ is applied to the plate line PL in the condition that the high level voltage is applied to the word line WL as shown in FIG. 15(c), the state of data "1" is shifted to the operational point B of the GND level from the operational point A where the voltage $V_{DD}$ is applied. On the other hand, the state of data "0" is shifted from the operational point B of the GND level to the operational point C where the negative voltage-$V_{DD}$ is applied.

(m) Next, a period during the timing t11 to t13 also indicates the data write-in operation of the FRAM operational mode. As shown in FIG. 15(d), when the high level voltage $V_{DD}$ applied to the plate line PL is returned to GND in the condition that the high level voltage is applied to the word line WL, the state of data "1" is shifted from the operational point B of the GND level to the operational point A when the voltage $V_{DD}$ is applied. On the other hand, the state of data "0" is shifted to the operational point D of the GND level from the operational point C where the negative voltage-$V_{DD}$ is applied.

Data Hold and Power Supply Cutoff Period

A period during the timing t13 to t15 indicates the data hold state. As shown in FIG. 15(e), the storage state of data "1" is in the operational point A where $V_{DD}$ is applied, on the hysteresis characteristic. On the other hand, the storage state of data "0" is in the operational point D where the ground potential GND is applied, on the hysteresis characteristic. During the period which is powering ON among the timing t13 to t15, the data hold is possible with both of the quantity of electrically charged up charges and the quantity of residual polarization electric charge. The data write-in operation is performed as residual polarization while refreshing the data. In addition, the period U4 during the timing t14 to t15 is equivalent to a power supply cutoff period.

Data Read-Out Operation of FRAM Operational Mode

A period U5 during the timing t15 to t21 indicates the data read-out operation of the FRAM operational mode.

(n) In the timing t15, the read-out request signal RD is turned to the high level.

(o) Next, in the timing t16, the word line control signal WLC is turned ON, the plate line control signal PLC is turned ON, and the potential of the word line WL is turned to the high level. Simultaneously, the bit line capacitor control signal BLCC is turned ON, and the potential of the bit line capacitor control line BLC is turned to the high level. The load capacitor adjustment transistor QL is turned ON and the capacitor of bit line BL becomes $C_B+C_L$ by applying the high level voltage to the bit line capacitor control line BLC in the condition that the high level voltage is applied to the word line WL.

(p) Next, in the timing t17, when the potential of plate line PL is turned to the high level in the condition that the high level voltage is applied to the word line WL, a minute electrical change occurs on the bit lines BL and BL#, as shown in the period of the timing t17 to t18.

(q) Next, in the timing t18, when the sense amplifier control signal SAE is turned ON, the voltage level of the potential of the bit lines BL and BL# is settled by the latchup operation of the sense amplifier. The voltage which appears on the bit line BL# is reference voltage.

Data Hold (r) A period after the timing t21 indicates the data hold state at the time of the normal operation mode. The storage state of data "1" is in the operational point A where $V_{DD}$ is applied as well as the period U1 of the timing t0 to t1, on the hysteresis characteristic. On the other hand, the storage state of data "0" is in the operational point B where the ground potential GND is applied, on the hysteresis characteristic of the ferroelectric memory cell.

According to the present embodiment, it can be compatible in improvement in the speed by the BL capacitor reducible in the DRAM mode, and the BL capacitor securing in the FRAM mode, by providing the load capacitor adjustment cell on the BL, and separately setting the capacitor on the BL between the DRAM mode and the FRAM mode.

According to the present embodiment, it can be made to operate by the DRAM operational mode with small capacitor load for high-speed operation at the time of the normal operation mode, and can be made to operate by the FRAM operational mode for the data hold of the power OFF period at the time of power ON/OFF.

According to the present embodiment, since the load capacitor adjustment cell can be composed from same structure as the ferroelectric memory cell for holding data and it connects with BL via the access transistor only at the time of the FRAM mode, the configuration can be simplified.

Also, according to the present embodiment, in order to shorten the time of the data restoring (FRAM mode write-in) which is occurred at the time of the power supply cutoff, since the target ferroelectric memory cell is in the data hold state in not only the quantity of residual polarization electric charge but the quantity of electrically charged up charges, the data is non-volatilizing and read-out by the DRAM mode is also possible, in the refresh cycle at the time of the normal operation mode (DRAM mode). In this case, if the refresh cycle is considered into 10 m seconds, for example, the number of times of the polarization inversion per 1 second is $10^2$ times. Therefore, since the endurance for three years is about $10^8$ seconds, even if it performs polarization inversion at the time of refresh, it is satisfactory in endurance.

According to the present embodiment, although the ferroelectric memory cell is in the state of holding data only with the quantity of electrically charged up charges when the DRAM mode read-out/write-in is performed for the ferroelectric memory cell after the refresh cycle, since it tends to concentrate the data access part into the ferroelectric memory device on a local part and the probability that the DRAM mode read-out is performed after the refresh cycle is low, the ferroelectric memory cell which actually performs the data restoring at the time of power supply cutoff can be limited only to a local part, and can achieve large improvement in the speed as compared with all the ferroelectric memory cell data restoration.

Therefore, according to the first embodiment, improvement in the speed of operating speed of the same grade as SRAM can achieve.

Also, according to the present embodiment, improvement in the speed of the data restoring process at the time of the power supply cutoff can be achieved.

Moreover, according to the present embodiment, as compared with FRAM which performs polarization inversion each time, the number of times of polarization inversion can be reduced, and the characteristic degradation of the ferroelectric device can be suppressed.

Other Embodiment

As mentioned above, the present invention has been described by the first embodiment, as a disclosure including associated description and drawings to be construed as illustrative, not restrictive. With the disclosure, artisan might easily think up alternative embodiments, embodiment examples, or application techniques.

Thus, the present invention includes various embodiments etc. which have not been described in this specification.

INDUSTRIAL APPLICABILITY

The ferroelectric memory device according to the present embodiment of the present invention is applicable to wide fields, such as nonvolatile memory and hybrid (embedded) LSI memory.

The invention claimed is:

1. A ferroelectric memory device comprising:
a plurality of bit lines disposed in a column direction;
a plurality of word lines intersecting perpendicularly with the bit lines and disposed in a row direction;
a plurality of plate lines intersecting perpendicularly with the bit lines and disposed in a row direction;
a bit line control line intersecting perpendicularly with the bit line and disposed in a row direction;
a ferroelectric memory cell disposed adjacent an intersection of one of the bit lines and one of the word lines, and adjacent an intersection of the bit line and one of the plate lines, the ferroelectric memory cell including a ferroelectric capacitor and a memory cell transistor, an electrode of one side of the ferroelectric capacitor being connected to the plate line, the memory cell transistor connecting a source to an electrode of another side of the ferroelectric capacitor, connecting a drain to the bit line, and connecting a gate to the word line; and
a load capacitor adjustment cell disposed adjacent an intersection of one of the bit lines and the bit line control line, the load capacitor adjustment cell including a load capacitor and a load capacitor adjustment transistor, an electrode of one side of the load capacitor being connected to ground potential, the load capacitor adjustment transistor connecting a source to an electrode of another side of the load capacitor, connecting a drain to the bit line, and connecting a gate to the bit line control line, wherein both of the ferroelectric memory cell and the load capacitor adjustment cell are commonly connected to a same one of the bit lines.

2. The ferroelectric memory device according to claim 1, wherein the ferroelectric capacitor comprises at least one ferroelectric thin film layer.

3. The ferroelectric memory device according to claim 2, wherein data stored in the ferroelectric memory cell is held by one of an electric charge charged by the ferroelectric capacitor and a quantity of residual polarization electric charge inside the ferroelectric thin film layer.

4. The ferroelectric memory device according to claim 1, wherein a capacitor of the bit line connected to the ferroelectric memory cell is adjusted.

5. The ferroelectric memory device according to claim 3, wherein when reading the data in the ferroelectric memory cell, the load capacitor adjustment cell switches the capacitor of the bit line depending on the case of being held with the quantity of electrically charged up charged by the ferroelectric capacitor, and the case of being held by the quantity of residual polarization electric charge inside the ferroelectric thin film layer.

6. The ferroelectric memory device according to claim 5, wherein when held with the quantity of electrically charged up charged by the ferroelectric capacitor, data is held also as the quantity of residual polarization electric charge inside the ferroelectric thin film layer at the time of a refresh operation.

7. The ferroelectric memory device according to claim 5, wherein after power supply cutoff, data is held for the memory cell which does not hold data as the quantity of residual polarization electric charge inside the ferroelectric thin film layer, as the quantity of residual polarization electric charge inside the ferroelectric thin film layer.

8. The ferroelectric memory device according to claim 5, wherein after powering ON, data is held for the memory cell which holds data as the quantity of residual polarization electric charge inside the ferroelectric thin film layer, as the quantity of electrically charged up charged by the ferroelectric capacitor.

* * * * *